United States Patent [19]
Holst et al.

[11] Patent Number: 5,205,619
[45] Date of Patent: Apr. 27, 1993

[54] ELECTRONIC CIRCUIT FOR SURVEILLANCE OF FINAL AMPLIFIER AND ITS LOAD

[75] Inventors: Hans Holst; Klaus Pape, both of Hanover; Gerhard Ruhnau, Neustadt, all of Fed. Rep. of Germany

[73] Assignee: WABCO Westinghouse Fahrzeugbremsen GmbH, Hanover, Fed. Rep. of Germany

[21] Appl. No.: 573,082

[22] Filed: Aug. 28, 1990

[30] Foreign Application Priority Data

Aug. 30, 1989 [DE] Fed. Rep. of Germany ....... 3928651

[51] Int. Cl.⁵ .......................... B60T 8/32; B60T 17/18
[52] U.S. Cl. ......................................... 303/92; 303/20
[58] Field of Search ............. 303/20, 92, 91, 102–109, 303/95, 100; 188/181 A, 181 C, 181 R; 73/121

[56] References Cited

U.S. PATENT DOCUMENTS

| | | | |
|---|---|---|---|
| 4,050,747 | 9/1977 | Ruhnau et al. | 303/95 X |
| 4,136,912 | 1/1979 | Hesse et al. | 303/20 X |
| 4,460,962 | 7/1984 | Pape et al. | 303/95 X |
| 4,547,740 | 10/1985 | Nilsson . | |
| 4,635,607 | 1/1987 | Yasuoka et al. . | |
| 4,925,254 | 5/1990 | Holst et al. | 303/100 X |

FOREIGN PATENT DOCUMENTS

| | | |
|---|---|---|
| 1065460 | 9/1959 | Fed. Rep. of Germany . |
| 2631569 | 1/1978 | Fed. Rep. of Germany . |
| 270159 | 7/1978 | Fed. Rep. of Germany . |
| 2909384 | 9/1979 | Fed. Rep. of Germany . |
| 2928981 | 2/1981 | Fed. Rep. of Germany . |
| 3227285 | 2/1983 | Fed. Rep. of Germany . |
| 3322074 | 1/1984 | Fed. Rep. of Germany . |
| 3447449 | 7/1985 | Fed. Rep. of Germany . |
| 3446645 | 7/1986 | Fed. Rep. of Germany . |
| 3522392 | 1/1987 | Fed. Rep. of Germany . |
| 3701795 | 7/1987 | Fed. Rep. of Germany . |
| 3706393 | 5/1988 | Fed. Rep. of Germany . |
| 3701714 | 8/1988 | Fed. Rep. of Germany . |
| 3833333 | 4/1989 | Fed. Rep. of Germany . |
| 146658 | 2/1981 | German Democratic Rep. . |

OTHER PUBLICATIONS

Patent Abstract of Japan Ser. No. 52-103342, May 18, 1979, vol. 3/No. 58.

*Primary Examiner*—Douglas C. Butler
*Attorney, Agent, or Firm*—Horst M. Kasper

[57] ABSTRACT

An electronic circuit, in particular for an anti-skid protection system for vehicles is provided with at least with one microcomputer (2). The microcomputer (2) controls a load (4) via a final amplifier (3). A resistor circuit (6, 7, 8) is furnished for surveillance of the final amplifier (3) as well as of the load (4). The resistor circuit (6, 7, 8) is disposed parallel to the final transistor (5). The microcomputer (2) or a separate control circuit scans the voltage at the junction nodal point (9) between the final transistor (5) and the load (4) at predetermined points in time and checks it for appropriate level. The resistor circuit (6, 7, 8) is connectable via an electronic switch (10, 11), controlled by the microcomputer (2) or by the separate control circuit, as desired with the operating voltage $U_B$ or with ground. The circuit allows a distinction of errors of the final transistor (5) and of the load (4).

28 Claims, 3 Drawing Sheets

ELECTRONIC CIRCUIT FOR SURVEILLANCE OF FINAL AMPLIFIER AND ITS LOAD

BACKGROUND OF THE INVENTION

1. Field of the Invention

The invention relates to an electronic circuit for a surveillance of a final amplifier and its load and in particular of such final amplifier in connection with an anti-skid system for vehicles.

2. Brief Description of the Background of the Invention Including Prior Art

Anti-skid systems in motor vehicles set particular high standards and requirements relating to their functional reliability and safety. All possibly occurring electrical or mechanical defects have to be recognized as quickly as possible. The electronic circuit then has to react in such a way that the system, for example by way of a partial shutoff, is returned into a safe state. In extreme cases, the anti-skid protection has to be turned off such that the vehicle can then be braked only in a conventional manner.

Test circuits for the electronic circuitry of anti-skid systems are known For example, the German Patent Application Laid Out DE-A-2,631,569 teaches that test pulses are fed into a control channel, which test pulses are scanned behind the final amplifier and which are investigated relative to their proper values The pulses are in this case of such a short duration that the following solenoid valve does not switch mechanically.

A part system of the anti-skid system to be monitored in particular is the final stage of the anti-skid system. Conventionally, this final stage is controlled by a logic circuit or by a microcomputer corresponding to the wheel speeds or, respectively, the wheel accelerations of the monitored wheel.

The power transistor of the final stage controls the power supply of a solenoid valve for controlling the corresponding wheel brake.

The following errors can occur in this context. The winding of the solenoid valve, representing a load, can experience an interruption, a short circuit, or an impermissible resistance value. The same error possibilities exist also for the connection cable between the final stage and the load.

Furthermore, the final transistor itself can exhibit an open circuit or a short circuit connection.

In order to sense the errors of the recited kind, it is conceivable to include a low-impedance current measuring resistor in the connection line to the load. With such a low-impedance current measuring resistor, a current value, which is either too high or too low, can be recognized. In case of the high currents to be switched in an anti-skid system, the voltage drop at the measuring resistor would, however, be impermissibly high.

It is further conceivable to recognize an error indirectly via a switch-on-duration surveillance device monitoring the solenoid valve usually present in the system. However, this is not possible in all cases. For example, in case of a down-shifting in a vehicle on a slippery road, covered with ice or snow, a wheel can lock and skid during an extended time period without that a braking occurs. An error would then be indicated in this case, even though the circuit were in fact to operate correctly.

The German Patent DE-2,701,159 C 3 to Karl Heinz Hesse et al. teaches a switching circuit for periodical testing of the functioning of parts of an anti-skid protected, pressure-actuated motor vehicle brake system. The system employs several safety and automatic control circuits to obtain a test result.

The German Patent Laid Out 1,065,460 to Wilfried Fritzsche teaches a circuit for the switching on and switching off of inductance loads. The reference is very limited in that it does not address the particular problems associated with anti-skid systems.

The German Patent Application Laid Open DE-3,833,333 Al to Akihisa Nakamura teaches a control device for automatically controlling the throttle device of a combustion engine with internal combustion. The reference includes a control circuit with a cycle oscillating device for generating of a test signal of a time duration which is shorter than the reaction time of the throttle. It is submitted that this reference, while indicating certain control principles, clearly falls short to be of use in connection with an anti-skid system.

The German Patent Application Laid Open DE-3,706,393 Al to Stanislav Jeroncic teaches the application of a internal-diagnosis method. The reference is in particular concerned with the measurement of a voltage drop along a strategically placed resistor. However, the reference does not concern a structure related to an anti-skid system.

The German Patent Application Laid Open DE-OS 3,701,795 Al to Masahiko Asakura teaches a detection method for abnormal behavior in an air/combustion fuel ratio control system for combustion engines. While the reference is concerned with the detection of certain ratios and employs a computer logic and control circuits, it clearly does not provide a circuit directly suitable for an anti-skid system.

The German Patent Application Laid Open DE-OS 3,701,714 Al to Wolfgang Drobny et al. teaches a method and a device for surveillance of computer-controlled set members. The reference is directed to determining certain error cases based on signal probes. However, no system is taught which would be directly applicable to an anti-skid safety system.

The German Patent Application Laid Open DE-OS 3,522,392 Al to Fritz Hofmann et al. teaches an electric set system, in particular for operating a steering gear. The output of the final amplifier 8 or, respectively, of the set motor 2 of the reference structure is connected to a test circuit 17, which tests the operation of the set motor within the framework of a pulsed test operation under reduced load. It is noted that this reference is not concerned with an anti-skid system and, in particular, with safety features required and appropriate for such a system.

The German Patent Application Laid Open DE-OS 3,447,449 Al to Peter Cyril Byrne teaches an electronic control apparatus for an anti-skid system. A microcomputer is employed and the monitoring circuit comprises a reset device for the microcomputer, which resets the microcomputer if the performance of the program falls out of synchronization. The sensing device tests if the wheel speed sensors are short-circuited or separated or not. It appears that, testing of the sensors, however, will not assure that a braking effect will occur even if the sensors operate.

The German Patent Application Laid Open DE-OS 3,446,645 Al to Karl Kapp teaches a switching arrangement for the formation of a current signal. According to the reference, the user load 5 is connected diagonally relative to a transistor bridge 1–4, and a supply voltage source is connected to a second diagonal of the transistor bridge. While the reference further teaches that the current signal can be picked up at two corresponding transistors, nevertheless, this system shows very little which would indicate any applicability in connection with a braking system with anti-skid protection.

The German Patent Application Laid Open DE-OS 3,322,074 A1 to Wolfgang Kosak teaches an emergency running device for microcomputer-controlled systems. An emergencyrun function generator 24 is provided and, in case of the occurrence of a fail-safe signal $U_{FS}$, actuates a reset input 21 of a microcomputer 10 and, simultaneously, feeds the emergency signal $U_N$ via a logic 30 to the system. While these features and structures may have certain merits in connection with other devices, it is not clear what the structure, taught in this reference, would do and if it would be suitable to be used in connection with an anti-skid protection system.

The German Patent Application Laid Open DE-OS 3,227,285 A1 to Shinichi Hori teaches an automatic control system for drive machines. The control system of this reference is formed such that, in case of the expected occurrence of an error in the mode of operation of the set actuation switch, the switch remains out of operation and, in case of a standard control by the set actuation switch, indicates the operational state of the system. No specific relation appears to be made in this reference to the exigencies and requirements of an anti-skid system.

The German Patent Application Laid Open DE-OS 2,928,981 to Karl-Heinz Hesse et al. teaches a test circuit for the controller of an anti-lock protected motor vehicle brake, which is furnished with at least one control microcomputer for the control channels. It appears, however, that this reference does not specifically relate to a control of the actual brake function, but relates to a testing of the automatic control device.

The German Patent Application Laid Open DE-OS 2,909,384 to Takao Sato teaches an automatic control arrangement for the control rod drive of hot-water reactors. The reference surveys the operation of a respective step motor with a test signal. It is believed that this teaching does not teach how to meet the requirements of an anti-skid protection system in a motor vehicle.

The German Democratic Republic Patent 146,658 to Gerd Niemand teaches a measurement and surveillance circuit for dynamic electrical characteristic values. The voltage furnished by a measurement probe is compared to two reference values and is processed by way of comparators, trigger circuits, and an integrator circuit. No direction is given in this reference to employ any of the circuitry illustrated in connection with anti-skid protection system in a vehicle.

The U.S. Pat. No. 4,635,607 to Yasuoka et al. teaches an apparatus for controlling the supply of fuel to an internal combustion engine. The detector of the reference is to detect any disorder in the amount of combustion air and for providing a disorder indicating signal. However, the presence of the amount of combustion air appears to be an insufficient detection basis where an electric anti-skid protection system is desired to be automatically controlled.

The U.S. Pat. No. 4,547,740 to Kurt A. I. Nilsson teaches a monitoring device for integrated drive amplifiers which is intended to be driven by digital signals and which includes fault detection circuits. However, this circuit structure does not appear to be directly concerned skid protection system for a vehicle.

The Patent Abstract of Japan, entitled "Overload Detecting Circuit of Power Amplifier," of May 18, 1979, Vol. 3, No. 58, applied for in Japan on Aug. 29, 1977 and receiving the Japanese Publication No. 54-37448, is concerned with the existence of certain overload conditions. It appears, however, that this reference does not pay particular attention to the specific needs existing in connection with an anti-skid protection system for a motor vehicle.

SUMMARY OF THE INVENTION

1. Purposes of the Invention

It is an object of the present invention to furnish a circuit which allows the reliable recognition of errors, in particular, of short circuits in a final stage, or of an interruption in a connection cable or of the load of an electronic circuit, in particular in connection with an anti-skid protection system.

It is a further object of the present invention to provide an error-control circuit which is capable of distinguishing various errors which can possibly occur in connection with a anti-skid protection system.

These and other objects and advantages of the present invention will become evident from the description which follows.

2. Brief Description of the Invention

The present invention provides for an electronic circuit for the surveillance of a final electronic stage and load. A final amplifier includes a final transistor and is connected to the load. A microcomputer is connected to the final amplifier for a generation of control signals for the load. A resistor circuit is disposed parallel to the final transistor of the final amplifier and is connected to the load and to the microcomputer. An electronic switch is connected to the resistor circuit and is connected to ground such that the resistor circuit can be switched to ground. A unction nodal point of the final transistor and of the load allows a scanning of a voltage present at the junction nodal point and testing of the voltage value for amounting to a permissible voltage signal.

The load can comprise an anti-skid protection system for vehicles and in particular a solenoid valve. The resistor circuit can be switched to ground by the electronic switch through the microcomputer. The microcomputer preferably scans the voltage present at the nodal point and further the microcomputer controls the electronic switch at fixed time interval points.

The resistor circuit advantageously is switched to ground by a separate control circuit where the voltage present at the nodal point is scanned by the separate control circuit. The separate control circuit controls the electronic switch at fixed time interval points.

The resistor circuit comprises a first resistor connected between the nodal point and the electronic switch. The electronic switch connects the first resistor selectively to a supply voltage $U_B$ or to ground. The resistor circuit alternatively comprises two resistors disposed in series, wherein the electronic switch is connected at the connection point between the two resistors. The connection point is connected to ground via the electronic switch. The microcomputer controls the switch at predetermined points in time.

According to further aspect of the invention, the resistor circuit comprises two resistors disposed in series, where the electronic switch is connected at the connection point between the two resistors. The connection point is connected to ground via the electronic switch. The separate control circuit controls the switch at predetermined points in time.

The electronic switch is formed as a transistor switch operating as a push-pull power amplifier. An output line is connected to the electronic switch and to the microcomputer. The output signal of the electronic switch can be fed to the microcomputer via the output line. A switch control line connects the microcomputer and the electronic switch. The microcomputer can test the control signal on the switch control line with the output signal on the output line with respect to logical conformity.

An output line is connected to the electronic switch and to the microcomputer and wherein the output signal of the electronic switch is fed via the output line to a separate control circuit. A switch control line connects the separate control circuit and the electronic switch. The separate control circuit tests the control signal on the switch control line with the output signal on the output line with respect to logical conformity.

A distinguishing feature is of particular importance in connection with an anti-skid system for vehicles. In case of an anti-skid system, an error of the final transformer, in particular of a short circuit, the system has to be shut off immediately since the respective wheel could not be braked any longer in view of the constant current supply to the solenoid control valve and a critical situation would exist.

In contrast, in case of an interruption of the load, the system does not have to be switched off since in this case only the wheel in question would be locked. This would further contribute to the brake effort and would consequently represent a non-critical situation.

The novel features which are considered as characteristic for the invention are set forth in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWING

In the accompanying drawing, in which are shown several of the various possible embodiments of the present invention.

DESCRIPTION OF INVENTION AND PREFERRED EMBODIMENT

Figure 1:
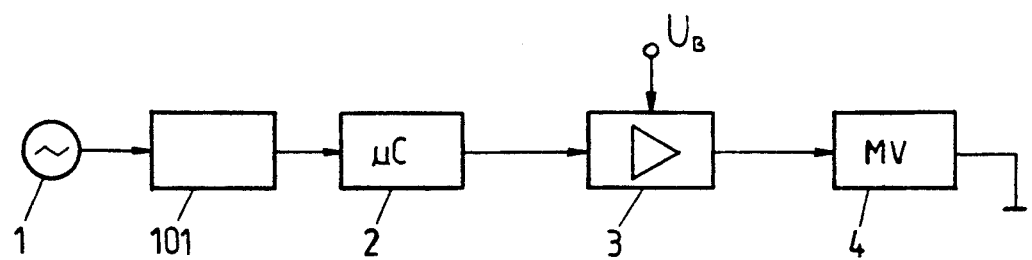
FIG. 1 is a block circuit diagram of an anti-skid system according to the state of the art.

A conventional vehicle anti-skid system is illustrated as a block circuit diagram in FIG. 1. The kind of surveillance circuit to which the present invention belongs, is to be illustrated initially in connection with this circuit. The circuit can, of course, also be employed in connection with other electronic circuits involving final amplifiers.

An electronic circuit for the surveillance of a final amplifier 3 and/or of its load 4, in particular in an anti-skid protection system for vehicles, includes at least one microcomputer 2 for a generation of control signals for a load 4, represented by a solenoid valve (MV). A final amplifier 3 is disposed between a microcomputer 2 and the load 4. A resistor circuit, comprised of a single resistor 6 and/or two series resistors 7, 8, is disposed parallel to the final transistor 5 of the final amplifier 3. A connection of the resistor circuitry 6, 7, 8 is switchable to ground by way of an electronic switch 10, 11 through the microcomputer 2 or by a separate control circuit to ground. The microcomputer 2 or the separate control circuit scan the voltage at the junction nodal point 9 of the final transistor 5 and of the load 4 and test the voltage value for representing an appropriate level.

Figure 2:
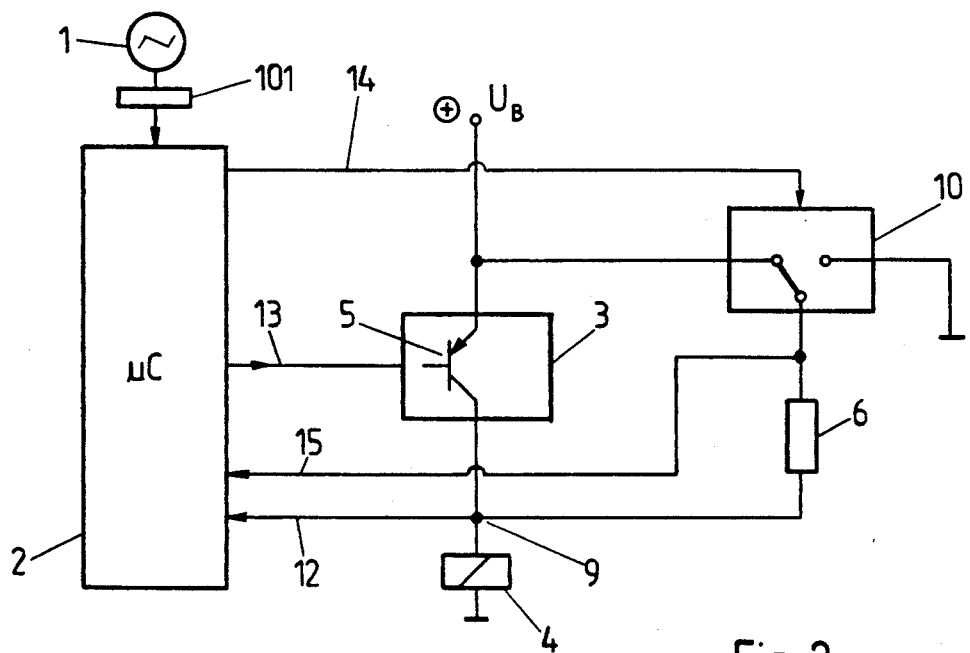
FIG. 2 is a view of a first embodiment of the invention surveillance circuit.

A connection of the resistor 6 is connectable selectively to a supply voltage $U_B$ or to ground via an electronic switch 10 (FIG. 2). The microcomputer 2 or the separate control circuit controls the electronic switch 10 at fixed time interval points.

Alternatively a electronic switch 11 (FIG. 3) is connected at the connection point 109 between the resistors 7, 8 and the connection point is connected to ground via the electronic switch 11. The microcomputer 2 or the separate control circuit controls the switch 11 at predetermined points in time. The switch 10, 11 is advantageously formed as a transistor switch operating as a push-pull power amplifier.

The output signal of the electronic switch 10, 11 is fed via an output line 15 to the microcomputer 2 or to a separate control circuit. The microcomputer 2 or the separate control circuit test the control signal on the switch control line 14 with the output signal on the output line 15 for logical conformity.

Constructively, the electronic circuit for the surveillance of a final electronic stage and load 4 has a sensor 1. A digitizer 101 is connected to the sensor. A microcomputer μC is connected to the digitizer 101 for a generation of control signals for the load. A final amplifier 3 includes a transistor 5 having a first terminal, a second terminal and a third terminal with the first terminal connected to the microprocessor. A voltage source $U_B$ is connected to the second terminal of the final amplifier 3. A load 4 is connected with a first terminal to the third terminal of the final amplifier 3 and connected with a second terminal to ground A first resistor 6, 8 has a first and a second terminal and has its first terminal connected to the third terminal of the final amplifier 3 and has its second terminal connected to the microcomputer μC such as to allow scanning of a voltage present at the second terminal of the final amplifier 3 and testing of the voltage value for determining a presence of a permissible voltage signal at the second terminal of the final amplifier 3. An electronic switch 10, 11 has a first terminal connected to the second terminal of the first resistor 6, 8, has a second terminal connected to the microcomputer μC and has a third terminal connected to ground such that the first resistor 6, 8 can be switched to ground.

A first terminal of the second resistor is connected to a second can be connected to the second terminal of the first resistor 8. A second terminal of the second resistor can be connected to the second terminal of the final amplifier 3. A connection line can connect the second terminal of the final amplifier 3 to a fourth terminal of the electronic switch 10.

The electronic switch advantageously comprises a second transistor. A third resistor disposed in series with the second terminal of the electronic switch. Said second transistor can have a base connected to the third resistor. A fourth resistor can connect the base of the second transistor to ground. The emitter of the second transistor is preferably connected in series to the third terminal of the electronic switch. The first terminal of the electronic switch can be connected in series to the collector of the second transistor.

A third transistor can be furnished having its base connected to the collector of the second transistor, having its emitter connected to ground and having its collector disposed in series to the first terminal of the electronic switch. A fifth resistor has a first terminal connected to the collector of the second transistor. A fourth transistor has its base connected to the second terminal of the fifth resistor and has its collector connected in series to the first terminal of the electronic switch and has a base connected to the voltage source. A sixth resistor has a first terminal connected to the second terminal of the fifth resistor and has a second terminal connected to the power source.

A rotation-speed sensor 1, disposed at the wheel to be automatically controlled, generates signals which are proportional to the wheel speed. The signals are fed to a microcomputer 2 after processing in, for example, a digitizer 101 or in an analog digital converter. The microcomputer 2 comprises a program, according to which corresponding control signals for the load 4 are formed based on the signals received from the rotation speed sensor 1. The load 4 in this case is a solenoid valve and is disposed in the pressure conduit line of the brake cylinder of the corresponding wheel to be automatically controlled and not represented in this figure. However, reference is made to the anti-skid systems described in the references. A corresponding modulation of the brake pressure prevents in a conventional way a locking of the wheel and the wheel is at all times maintained automatically in the optimum slip region of about 20%.

Figure 3:
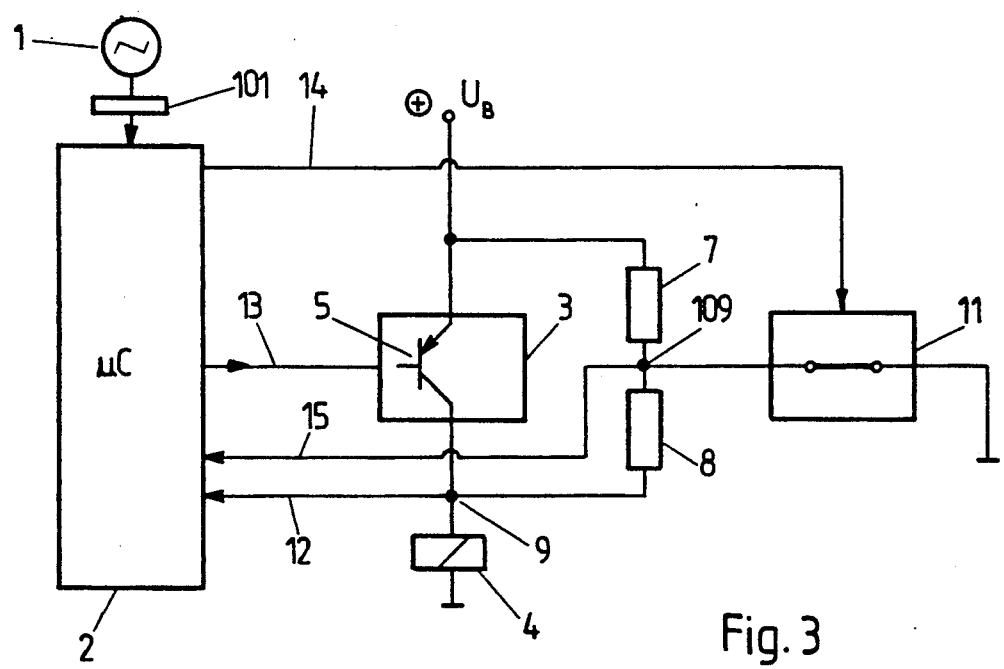
FIG. 3 is a view of a second embodiment of the invention surveillance circuit.

A final amplifier 3 is disposed between the microcomputer 2 and the solenoid valve 4 for amplification of the computer output signals. This final amplifier 3 comprises several transistors, of which the final transistor 5 is illustrated in FIGS. 2 and 3. A stabilized operating voltage $U_{stab}$ is sufficient for the microcomputer 2, while the final amplifier 3 is furnished with a direct connection to a vehicle battery $U_B$ because of the multiply higher current consumption required. For this reason, the microcomputer 2 cannot recognize immediately if, for example, in the case of a short circuit of the load, there is a pulling down of the battery voltage $U_B$.

The block circuit diagram of FIG. 1 is illustrated in an expanded and extended fashion in FIG. 2, including the invention structure for surveillance of the final amplifier 3. The same reference numerals in FIGS. 1 and 2 refer to the same structure components. The power transistor of the final amplifier 3 is designated with the reference numeral 5. This final amplifier 3 is controlled via a transistor control line 13 by the microcomputer 2 corresponding to the wheel motion. A load 4, which is in the present case a solenoid valve, is supplied via the transistor 5.

The power transistor 5 is by-passed by a series circuit of a resistor 6 and of a switch 10. One pole of the resistor 6 is connected to the junction nodal point 9 between the transistor 5 and the load 4. The second pole of the resistor 6 can be selectively connected to the emitter of the transistor 5 or to ground with the aid of the switch 10. This switch 10 is preferably formed a an electronic switch of a counter-cycle end stage, or a push-pull power stage. For switching purposes, a switch control line 14, originating at the microcomputer 2, is employed.

The state of the junction nodal point 9 between the power transistor 5 and the load 4 is surveyed and controlled by a surveillance circuit via monitoring line 12, where in the instant case, the surveillance circuit is provided by the microcomputer 2.

The invention circuit according to FIG. 2 operates as follows.

During each automatic control cycle of the anti-skid protection program or in defined time-period intervals, a test program with three steps is performed.

First, the transistor 5 or, respectively, the final amplifier 3 is switched on for a short time. In this case, the switch-on duration period is set in a conventional way to such a short duration that the load or, respectively, the solenoid valve 4 does not respond.

Second, the microcomputer 2 controls the switch 10 into the left switch position, i.e. at the emitter of the transistor 5. This is the standard position of the switch 10. The collector of the transistor 5 is thereby connected via the resistor 6 to the battery voltage $U_B$ or, respectively, to the emitter, and thus the collector of the transistor 5 is pulled up relative to its voltage level. The potential of the collector, i.e. the voltage of the Junction nodal point 9, is scanned by the microcomputer 2.

As a third step, the switch 10 is switched into the right switching position and thereby the function nodal point 9 is connected and pulled down via the resistor 6 to ground. The test cycle is thereby terminated and the switch 10 is reset to its standard state.

The junction nodal point 9 can also be scanned via a different microcomputer or via a separate surveillance device or, respectively, control circuit instead of the scanning via the microcomputer 2. This alternative control connects the signal of the transistor control line 13 with the signal of the monitoring line 12.

The test cycle described is also performed during an automatic anti-skid protection control. During the time periods, wherein the final transistor 5 is current-conducting during the automatic anti-skid protection control, the transistor 5 is switched off for a short time period. The switch-off time duration amounts to about 100 microseconds which is such a short time duration that the state of the solenoid valve 4 remains thereby unchanged. The switch-off voltage at the transistor 5 is thereby limited to about $-30$ volts. In the following, the already above described switching of the switch 10 and the simultaneous voltage surveillance of the junction nodal point 9 is performed by the microcomputer 2.

Of course, one single test, for example, upon switching on of the electronics, can be performed instead of a cyclical switching.

The critical error case "short circuit of the transistor 5" can be distinguished from the other non-critical error case "interruption of the connection line to the load 4 or, respectively, interruption within the load 4" based on the invention test circuit according to FIG. 2. The junction nodal point 9 normally assumes in both of these cases, i.e. without test circuit, the potential $+U_B$.

The resistor 6 is switched via the switch 10 to the emitter of the transistor 5. Based on this connection, a very small measurement current flows through the load 4 as compared to the exciter current of the solenoid valve 4. The value of the resistor 6 amounts to about 5 to 15 kiloohms, while the resistance of the load 4 may be about 15 ohms.

The surveillance circuit, represented by the microcomputer 2, recognizes the blocked transistor 5 despite the existing measurement current. In case of an interruption of the load the voltage at the junction nodal point 9 is pulled up, which initially appears to the surveillance circuit like a switched-on transistor 5.

For distinguishing between the critical and the non-critical case, the switch 10 is now controlled such that the resistor 6 is connected to ground and the signal on the monitoring line 12 is again evaluated. The surveillance circuit recognizes the state "broken cable," if the voltage at the junction nodal point 9 was thereby pulled down or, respectively, the state defective and faulty transistor, if the voltage remains at an unchanged high level.

The potential of the junction nodal point 9 in the described error case is pulled down to zero in case of a blocked transistor 5 by the invention circuit in the right position of the switch 10, i.e. in pull-down position. If this is possible, the microcomputer 2 therefrom recognizes that the transistor 5 cannot be affected by a short circuit.

In case of an interruption in the connection line or in the load 4, the potential of the junction nodal point 9 is pulled up to the battery voltage $U_B$ while the switch 10 is in the left position. The microcomputer 2 recognizes from this that the load 4 or, respectively, the junction nodal point 9 must be associated with an interruption, since otherwise a pulling up of the voltage would not be possible.

The embodiment of FIG. 3 represents a variant relative to the embodiment of FIG. 2. The resistor 6, as illustrated in FIG. 2, in this case is analogously subdivided into two series resistors 7, 8 of, in each case, 5 kilo-ohms An electronic switch 11 is connected at the unction point of the resistors 7, 8. This electronic switch 11 connects selectively the junction point of the resistors 7, 8 to ground. The switch 11 is again controlled by the microcomputer 2 via the switch control line 14 and is preferably also furnished as a transistor switch.

The circuit according to FIG. 3 is associated with the advantage that, instead of a switch as employed in FIG. 2, there is only required an on/off switch 11.

A short circuit of the transistor 5 is recognized by the microcomputer 2 in the case, where during a blocked transistor control line 13 or, respectively, a blocked transistor 5, the junction nodal point 9 nevertheless exhibits high potential and where the potential does no change upon subsequent switching on of the electronic switch 11.

The absence of a load 4 is then recognized, if the junction nodal point 9 exhibits a high potential in case of a blocked and properly operating transistor 5, and where the potential changes to zero or to a low value after a subsequent switching on of the electronic switch 11.

The ground can be connected to a voltage $-U_B$ in a conventional way in the circuits according to FIGS. 1 to 3. However, alternatively, a separate ground can be formed which is disposed in its potential level between the values $U_B$ and $-U_B$. Such a position of the ground does not change anything of the basic function of the circuit.

The microcomputer 2 or, respectively, the separate control circuit can preferably also test the function of the electronic switch 10, 11. For this purpose, the output of the switch 10, 11 is led back via an output line 15 to the microcomputer 2. The output line 15 tests then if a time and logical conformity exists with the control signal of the switch control line 14.

Figure 4:
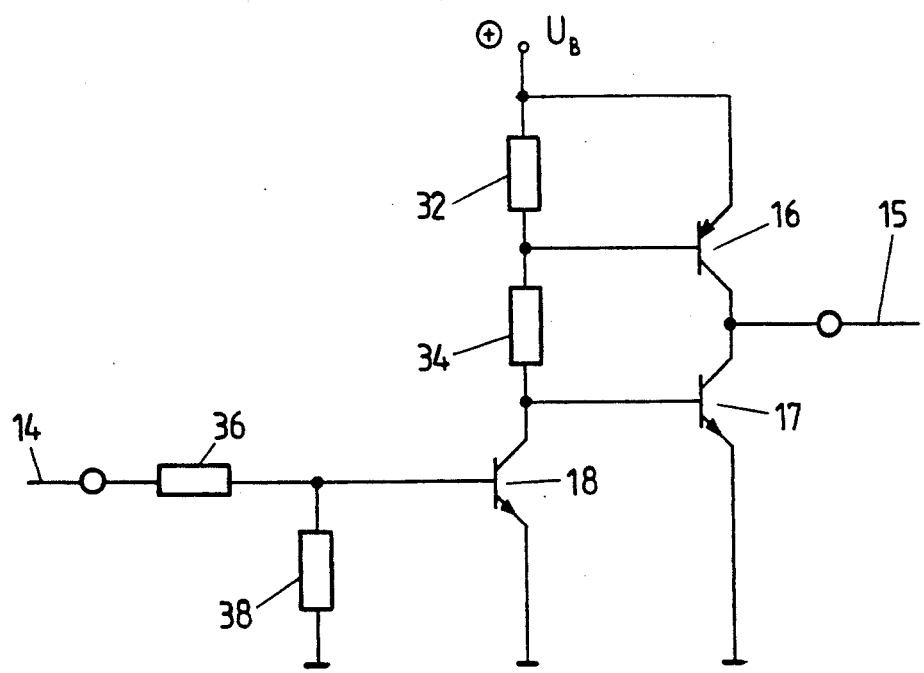
FIG. 4 is a view of a circuit diagram of an electronic switch useful in connection with the circuit structure of FIG. 2.

The internal structure of the electronic switch 10 is illustrated in FIG. 4.

If a high-level signal is present via the switch control line 14, then the transistor 18 is conducting. The base of the transistor 16 is thereby pulled down in its potential and the transistor 16 conducts the battery voltage $U_B$ to the output line 15. The transistor 17 blocks since its base is connected to ground.

The resistors 32 and 34 allow to adjust a bias voltage level of the base of the transistor 16. The resistor 36 represents a current-limiting transistor to the base of the transistor 18 and the resistor 38 establishes a bias voltage for the transistor 18.

If a low-level signal is present at the switch control line 14, then all transistors 16 through 18 change their state, and the output line 15 is connected to ground via the transistor 17.

Figure 5:
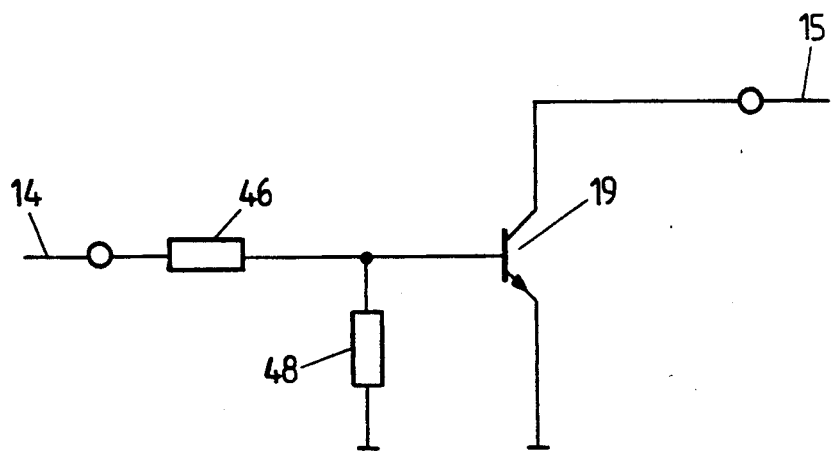
FIG. 5 is a view of a circuit diagram of an electronic switch useful in connection with the circuit structure of FIG. 3.

The internal structure of the electronic switch 11 is illustrated in FIG. 5.

If a high-level signal is present at the switch control line 14, then the transistor 19 is conductive and connects the output line 15 to ground.

A current-limiting resistor 46 is furnished relative to the base of the transistor 19. The resistor 48 establishes a bias level for the base of the transistor 19.

Figure 6:
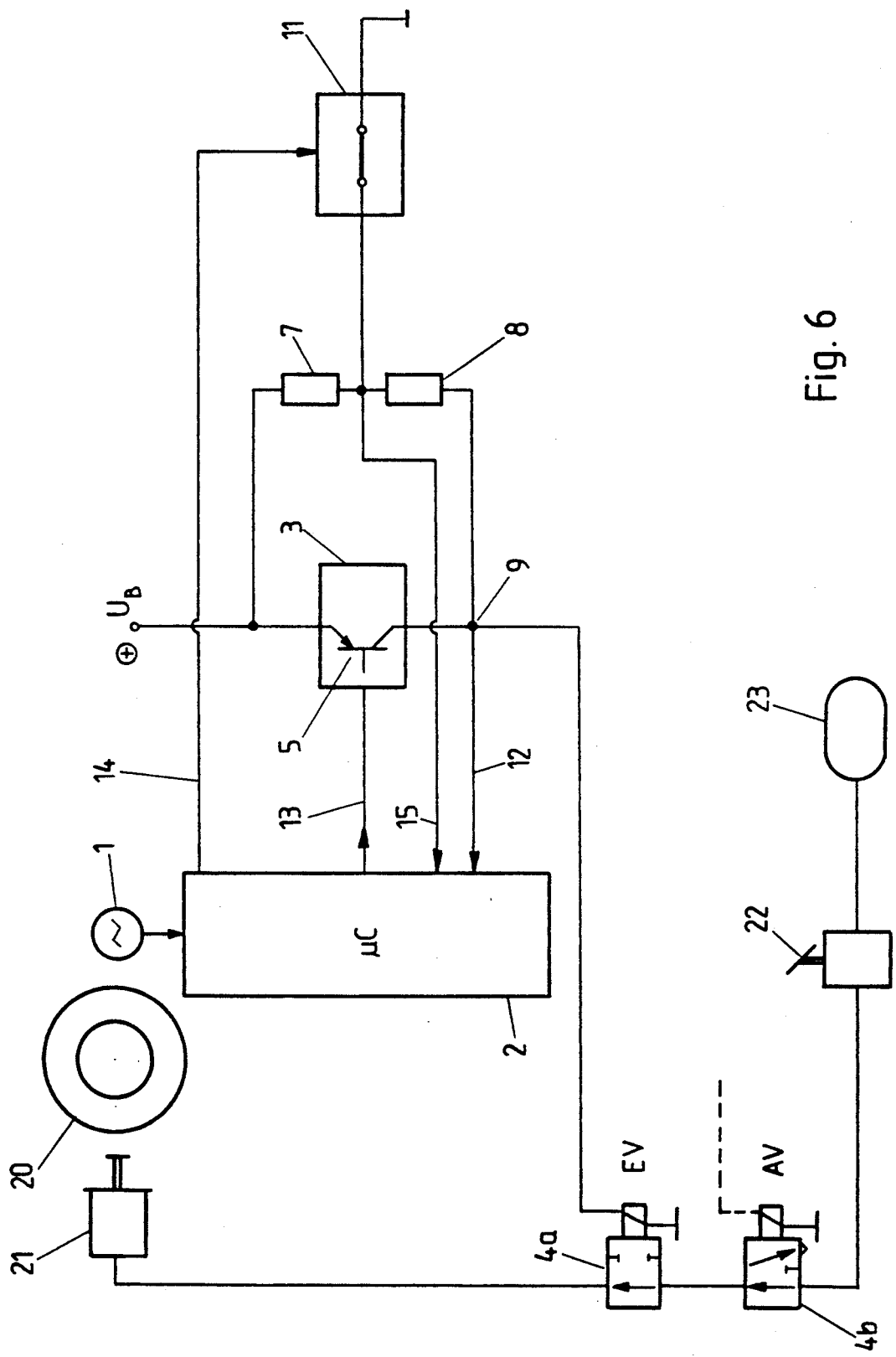
FIG. 6 is a view of an expended embodiment similar to the second embodiment illustrated in FIG. 3.

The FIG. 6 illustrates a motor vehicle wheel 20, and a brake cylinder 21, acting onto the vehicle wheel 20. A control valve 4 comprises an inlet valve EV and an outlet valve AV. The control valve 4 is connected to the brake cylinder 21 via the inlet valve EV. A foot pedal brake valve 22 is connected to the outlet valve AV. A compressed air storage container 23 is connected to the foot pedal brake valve 22. A transistor 5 is employed for controlling the inlet valve EV. A further, additional transistor 5 is furnished for the outlet valve, which can also be controlled by the microcomputer. This connection from the outlet valve to the additional transistor 5 is indicated by partial dashed line and the respective transistor 5 for the outlet valve would be a transistor similar to the additional transistor 5 however, representing a separated circuit such that the control of the inlet valve EV and of the outlet valve AV could be performed separately.

It will be understood that each of the elements described above, or two or more together, may also find a useful application in other types of electronic circuits differing from the types described above.

While the invention has been illustrated and described as embodied in the context of an electronic circuit for surveillance of a final amplifier and its load, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. An electronic circuit for surveillance of a final electronic stage and load comprising a load;
   a final amplifier comprising a final transistor and wherein the final amplifier is connected to the load;
   a microcomputer connected to the final amplifier for a generation of control signals for the load;
   a resistor circuit disposed parallel to the final transistor of the final amplifier and connected to the load and to the microcomputer;
   an electronic switch connected to the resistor circuit and connected to ground such that the resistor circuit is switched to the ground;
   a junction nodal point of the final transistor and of the load allowing scanning of a voltage value present at the junction nodal point and allowing testing of a voltage value for consistency with a proper voltage signal.

2. The electronic circuit according to claim 1, wherein the microcomputer comprises an anti-skid protection system for vehicles.

3. The electronic circuit according to claim 1, wherein the load comprises a solenoid valve.

4. The electronic circuit according to claim 1, wherein the resistor circuit is switched to ground by the electronic switch through the microcomputer and wherein the microcomputer scans the voltage value present at the nodal point and wherein the microcomputer controls the electronic switch at fixed time interval points.

5. The electronic circuit according to claim 1, wherein the resistor circuit is switched to ground by a separate control circuit and wherein the separate control circuit scans the voltage value present at the nodal point and wherein the separate control circuit controls the electronic switch at fixed time interval points.

6. The electronic circuit according to claim 1, wherein the resistor circuit comprises
   a first resistor connected between the nodal point and the electronic switch.

7. The electronic circuit according to claim 6, wherein the electronic switch connects the first resistor selectively to a supply voltage $U_B$ or to ground.

8. The electronic circuit according to claim 1 wherein the resistor circuit comprises two resistors disposed in series, wherein the electronic switch is connected at a connection point between the two resistors and wherein the connection point is connected to ground via the electronic switch;
   wherein the microcomputer controls the switch at predetermined points in time.

9. The electronic circuit according to claim 1 wherein the resistor circuit comprises two resistors disposed in series, where the electronic switch is connected at a connection point between the two resistors and wherein the connection point is connected to ground via the electronic switch;
   wherein a separate control circuit including the microcomputer controls the electronic switch at predetermined points in time.

10. The circuit according to claim 1, wherein the switch is formed as a transistor switch operating as a push-pull power amplifier.

11. The circuit according to claim 4 further comprising
   an output line connected to the electronic switch and to the microcomputer and wherein an output signal of the electronic switch is fed via the output line to the microcomputer;
   a switch control line connecting the microcomputer and the electronic switch, wherein the microcomputer tests a control signal on the switch control line with the output signal for logical consistency.

12. The circuit according to claim 5 further comprising
   an output line connected to the electronic switch and to the microcomputer and wherein an output signal of the electronic switch is fed via the output line to the separate control circuit;
   a switch control line connecting the separate control circuit and the electronic switch, wherein the separate control circuit tests the control signal on the switch control line with the output signal on the output line for logical consistency.

13. An electronic circuit for surveillance of a final amplifier (3) and of a load (4) for an antiskid protection system, for vehicles, including at least one microcomputer (2) for a generation of control signals for the load (4), represented by a solenoid valve (MV), where the final amplifier (3) is disposed between the microcomputer (2) and the load (4), wherein
   a) a resistor circuit, comprised of a resistor (6), is disposed parallel to the final transistor (5) of the final amplifier (3);
   b) a connection of the resistor circuit (6, 7, 8) is switchable to ground by way of an electronic switch (10, 11) through the microcomputer (2)
   c) and wherein the microcomputer (2) scans the voltage at the junction nodal point (9) of the final transistor (5) and of the load (4) and tests the voltage value for representing an appropriate level.

14. The circuit according to claim 13, wherein
   a) the connection of the resistor (6) is connectable selectively to a supply voltage $U_B$ or to ground via an electronic switch (10);
   b) the microcomputer (2) controls the electronic switch (10) at fixed time interval points.

15. The circuit according to claim 13, wherein
   a) the resistor circuit comprises two resistors (7, 8) disposed in series, where an electronic switch (11) is connected at the connection point (109) between the two series resistors (7, 8) and the connection point is connected to ground via the electronic switch (11);
   b) the microcomputer (2) controls the switch (11) at predetermined points in time.

16. The circuit according to claim 13, wherein the switch (10) is formed as a transistor switch operating as a push-pull power amplifier.

17. The circuit according to claim 13, wherein
   a) the output signal of the electronic switch (10, 11) is fed via an output line (15) to the microcomputer (2);
   b) the microcomputer (2) tests the control signal on a switch control line (14) with the output signal on the output line (15) with respect to logical consistency.

18. An electronic circuit for surveillance of a final electronic stage and load for an anti-skid protection system comprising
   a sensor;
   a digitizer connected to the sensor;

a microcomputer connected to the digitizer for a generation of control signals for a load;

a final amplifier including a transistor having a first terminal, a second terminal and a third terminal with the first terminal connected to the microcomputer;

a voltage source connected to the second terminal of the final amplifier;

a load connected with a first terminal to the third terminal of the final amplifier and connected with a second terminal to ground;

a first resistor having a first and a second terminal, wherein the first terminal of the first resistor is connected to the third terminal of the final amplifier, and wherein the second terminal of the first resistor is connected to the microcomputer, such as to allow scanning of a voltage value present at the second terminal of the final amplifier and testing of the voltage value for determining a presence of a proper voltage signal at the second terminal of the final amplifier;

an electronic switch having a first terminal connected to the second terminal of the first resistor, having a second terminal connected to the microcomputer and having a third terminal connected to ground such that the first resistor is switched to ground.

19. The electronic circuit according to claim 18 further comprising
a second resistor having a first terminal, wherein the first terminal of the second resistor is connected to the second terminal of the first resistor, and having a second terminal, wherein the second terminal of the second resistor is connected to the second terminal of the final amplifier.

20. The electronic circuit according to claim 18 further comprising
a connection line connecting the second terminal of the final amplifier to a fourth terminal of the electronic switch.

21. The electronic circuit according to claim 18 wherein the electronic switch comprises
a second transistor including a second emitter, a second base and a second collector;
a third resistor disposed in series with the second terminal of the electronic switch and wherein said second transistor has a base connected to the third resistor;
a fourth resistor connecting the second base of the second transistor to ground; and
wherein the second emitter of the second transistor is connected in series to the third terminal of the electronic switch; and
wherein the first terminal of the electronic switch is connected in series to the second collector of the second transistor.

22. The electronic circuit according to claim 21 wherein the electronic switch further comprises a third transistor having a third base, wherein the third base of the third transistor is connected to the second collector of the second transistor, wherein the second emitter is connected to ground and wherein the second collector is disposed in series to the first terminal of the electronic switch;
a fifth resistor having a first terminal connected to the second collector of the second transistor a fourth collector, and a fourth emitter;
a fourth transistor having a fourth base; wherein the fourth base is connected to the second terminal of the fifth resistor, and wherein the fourth collector is connected in series to the first terminal of the electronic switch and wherein the fourth emitter is connected to the voltage source;
a sixth resistor having a first terminal connected to the second terminal of the fifth resistor and having a second terminal connected to the voltage source.

23. The electronic circuit according to claim 18, wherein the anti-skid protection system for vehicles forms part of the microprocessor.

24. An electronic circuit for surveillance of a final electronic stage and load comprising
a final transistor;
a microcomputer for connecting a final amplifier for a generation of control signals for a load;
a resistor circuit disposed parallel to the final transistor of the final amplifier and connected to the load and to the microcomputer;
an electronic switch connected to the resistor circuit and connected to ground such that the resistor circuit is switched to the ground;
a junction nodal point of the final transistor and of the load allowing scanning of a voltage value present at the junction nodal point and allowing testing of a voltage value for consistency with a proper voltage signal.

25. An electronic circuit for surveillance of a final electronic stage and load comprising
a load for an anti-skid protection system;
a final amplifier comprising a final transistor and wherein the final amplifier is connected to the load;
a microcomputer connected to the final amplifier for a generation of control signals for the load;
a resistor circuit disposed parallel to the final transistor of the final amplifier and connected to the load and to the microcomputer;
an electronic switch connected to the resistor circuit and connected to ground such that the resistor circuit is switched to the ground;
a junction nodal point of the final transistor and of the load allowing scanning of a voltage value present at the junction nodal point and allowing testing of a voltage value for consistency with a proper voltage signal.

26. The electronic circuit according to claim 25, further comprising
an output line connected to the electronic switch and to the microcomputer and wherein an output signal of the electronic switch is fed through the output line to the microcomputer;
a switch control line connecting the microcomputer and the electronic switch, wherein the microcomputer tests a control signal on the switch control line and the output signal for logical consistency,
wherein the load comprises a solenoid valve,
wherein the resistor circuit is switched to ground by the electronic switch through the microcomputer and wherein the microcomputer scans the voltage value present at the junction nodal point and wherein the microcomputer controls the electronic switch at fixed time interval points, and
wherein the resistor circuit comprises
a first resistor connected between the nodal point and the electronic switch, wherein the electronic switch connects the first resistor selectively to a supply voltage $U_B$ or to ground, and
wherein the electronic switch is formed as a transistor switch operating as a push-pull power amplifier.

27. The electronic circuit according to claim 25,
an output line connected to the electronic switch and to the microcomputer and wherein an output signal of the electronic switch is fed via the output line to the microcomputer;
a switch control line connecting the microcomputer and the electronic switch, wherein the microcomputer tests the control signal on the switch control line and the output signal on the output line for logical consistency,
wherein the resistor circuit is switched to ground by the microcomputer and wherein the microcomputer scans the voltage value present at the nodal point and wherein the microcomputer controls the electronic switch at fixed time interval points,
wherein the electronic switch is formed as a transistor switch operating as a push-pull power amplifier.

28. The electronic circuit according to claim 25, further comprising
an output line connected to the electronic switch and to the microcomputer and wherein an output signal of the electronic switch is fed through the output line to the microcomputer;
a switch control line connecting the microcomputer and the electronic switch, wherein the microcomputer tests a control signal on the switch control lines and the output signal for logical consistency,
wherein the load comprises a solenoid valve,
wherein the resistor circuit is switched to ground by the electronic switch through the microcomputer and wherein the microcomputer scans the voltage value present at the nodal point and wherein the microcomputer controls the electronic switch at fixed time interval points, and
wherein the resistor circuit comprises two resistors disposed in series, wherein the electronic switch is connected at a connection point between the two resistors and wherein the connection point is connected to ground through the electronic switch.

* * * * *